US 7,994,422 B2

(12) United States Patent
Jin et al.

(10) Patent No.: US 7,994,422 B2
(45) Date of Patent: Aug. 9, 2011

(54) PHOTOELECTROCHEMICAL CELL

(75) Inventors: Yong-Wan Jin, Seoul (KR); Jong-Min Kim, Suwon-si (KR)

(73) Assignee: Samsung SDI Co., Ltd., Gongse-dong, Giheung-gu, Yongin-si, Gyeonggi-do (KR)

( * ) Notice: Subject to any disclaimer, the term of this patent is extended or adjusted under 35 U.S.C. 154(b) by 1052 days.

(21) Appl. No.: 11/047,627

(22) Filed: Feb. 2, 2005

(65) Prior Publication Data

US 2005/0166960 A1    Aug. 4, 2005

(30) Foreign Application Priority Data

Feb. 4, 2004 (KR) ................. 10-2004-0007211

(51) Int. Cl.
*H01L 31/00* (2006.01)

(52) U.S. Cl. ........ 136/263; 136/252; 136/256; 429/111; 427/212; 427/258

(58) Field of Classification Search ........... 136/263, 136/252, 256; 429/111; 427/212, 258
See application file for complete search history.

(56) References Cited

U.S. PATENT DOCUMENTS

| | | | |
|---|---|---|---|
| 5,350,644 A | | 9/1994 | Graetzel et al. |
| 5,441,827 A | | 8/1995 | Gratzel et al. |
| 5,728,487 A | | 3/1998 | Gratzel et al. |
| 6,146,227 A | * | 11/2000 | Mancevski ............ 445/24 |
| 6,291,763 B1 | * | 9/2001 | Nakamura ............ 136/256 |
| 6,376,765 B1 | * | 4/2002 | Wariishi et al. ........ 136/263 |
| 6,706,963 B2 | * | 3/2004 | Gaudiana et al. ....... 136/263 |
| 2001/0028209 A1 | * | 10/2001 | Uemura et al. ......... 313/311 |
| 2002/0040728 A1 | * | 4/2002 | Yoshikawa ............ 136/263 |
| 2002/0182310 A1 | * | 12/2002 | Wang ................ 427/126.1 |
| 2003/0062082 A1 | * | 4/2003 | Miteva et al. .......... 136/263 |
| 2003/0185985 A1 | * | 10/2003 | Bronikowski et al. ... 427/258 |
| 2004/0265489 A1 | * | 12/2004 | Dubin ................. 427/212 |
| 2005/0098205 A1 | * | 5/2005 | Roscheisen et al. .... 136/263 |

FOREIGN PATENT DOCUMENTS

KR    1020030065957 A    8/2003

OTHER PUBLICATIONS

Longo et al., Dye-sensitized solar cells: a successful combination of materials. J. Braz. Chem. Soc., Nov./Dec. 2003, vol. 14, No. 6, p. 898-901. ISSN 0103-5053.*
Lee et al., Catalytic Growth of Single-Wall Carbon Nanotubes: An Ab Initio Study, Phys. Rev. Lett. 78, 2393-2396 (1997).*

(Continued)

*Primary Examiner* — Alexa D Neckel
*Assistant Examiner* — Golam Mowla
(74) *Attorney, Agent, or Firm* — Robert E. Bushnell, Esq.

(57) ABSTRACT

A particulate structure containing a carbon nanotube thus exhibiting improved electron-transferring property, a semiconductor electrode for a photoelectrochemical cell containing a carbon nanotube thus exhibiting improved electron-transferring property, an electrolytic solution for a photoelectrochemical cell containing a carbon nanotube thus exhibiting improved oxidation-reduction property, a reduction electrode for a photoelectrochemical cell containing a carbon nanotube thus exhibiting improved reduction property; and a photoelectrochemical cell applying at least one aspect above.

15 Claims, 1 Drawing Sheet

OTHER PUBLICATIONS

Bailey et al., Nanostructured materials for solar cells, 3rd World Conference on Photovoltaic Energy Conversion, May 11-19, 2008, Osaka, Japan.*

"Short-Circuit Current", accessed from "http://pvcdrom.pveducation.org/CELLOPER/ISC.HTM" on Feb. 10, 2010.*

Vincent et al., "Inclusion of carbon nanotubes in a TiO2 sol—gel matrix", Journal of Non-Crystalline Solids, vol. 311, Issue 2, Nov. 2002, pp. 130-137.*

Jitianu et al., "New carbon multiwall nanotubes —TiO2 nanocomposites obtained by the sol—gel method", Journal of Non-Crystalline Solids, vols. 345-346, Oct. 15, 2004, pp. 596-600.*

Jitianu et al., "Synthesis and characterization of carbon nanotubes—TiO2 nanocomposites", Carbon, vol. 42, Issues 5-6, 2004, pp. 1147-1151.*

Jung, et al. "Enhanced Photocurrent of Dye-Sensitized Solar Cells by Modification of $TiO_2$ with Carbon Nanotubes" Chemistry Society of Japan, Chemistry Letter 2002 p. 864-865.

Korean Office Action issued by Korean Patent Office on Aug. 10, 2010 corresponding to Korean Patent Application No. 10-2004-0007211 and Request for Entry of the Accompanying Office Action attached herewith.

* cited by examiner

US 7,994,422 B2

PHOTOELECTROCHEMICAL CELL

CLAIM OF PRIORITY

This application makes reference to, incorporates the same herein, and claims all benefits accruing under 35 U.S.C. §119 from an application for PHOTOELECTROCHEMICAL CELL earlier filed in the Korean Intellectual Property Office on 4 Feb. 2004 and there duly assigned Serial No. 10-2004-0007211.

BACKGROUND OF THE INVENTION

1. Field of the Invention

The present invention relates to a photoelectrochemical cell, and more particularly, to a dye-sensitized solar cell. The present invention also relates to a particulate structure, a semiconductor electrode for a dye-sensitized solar cell, an electrolyte for a dye-sensitized solar cell, and a reduction electrode for a dye-sensitized solar cell.

2. Description of the Related Art

A photoelectrochemical cell is collectively referred to a cell that, upon receiving light, an electrochemical reaction occurs and an electric potential difference between both electrodes is generated. The types of the photoelectrochemical cells generally include a photovoltaic cell and a photoelectrolytic cell.

The representative example of the photovoltaic cell type of the photoelectrochemical cell is a dye-sensitized solar cell. The dye-sensitized solar cell was first developed by Michael Gratzel and colleagues at EPFL (Ecole Polytechnique Federale de Lausanne) in Switzerland in 1991 (see U.S. Pat. Nos. 5,350,644, 5,441,827 and 5,728,487). The dye-sensitized solar cell is an energy converting apparatus that converts light energy into electrical energy. The main constituents of the dye-sensitized solar cell are a photosensitive dye that absorbs the visible light and generates electron-hole pairs, and a transition metal oxide semiconductor that transfers the generated electrons. The dye-sensitized solar cell can be used as a sensor or a power supply.

The production cost of the dye-sensitized solar cell is low and the efficiency of the energy conversion is high compared with a silicon photocell using a pn junction of a semiconductor. The dye-sensitized solar cell is a promising device that can serve as a substitute for the silicon photocell which has high production costs.

The operating principle of the general dye-sensitized solar cell is illustrated in FIG. 1. As illustrated in FIG. 1, when a ray of light, such as solar light is irradiated on a semiconductor electrode 11 made up of an n-type metal oxide semiconductor in which dye molecules are chemically adsorbed to its surface, the dye molecules that adsorb the ray of light are electronically raised from the ground state (D+/D) to an excited state (D+/D*) thus generating electron-hole pairs. These electrons (e−) are in the conductive bands of the n-type metal oxide semiconductor. The electrons transferred to the n-type metal oxide semiconductor are transferred to a conductive transparent substrate 12, and then fed to a load L via a conducting wire 13. The electrons passing through the load L are transferred to a platinum reduction electrode 14 via a conducting line 13'.

An oxidation-reduction electrolyte 15 often contains iodide ions and is infused between the semiconductor electrode 11 and the reduction electrode 14. The electronically transited and then oxidized dye molecules (D→D+) receive the electrons provided by the oxidation of iodide ions ($3I^{-1} \rightarrow I_3^{-1}$) in the oxidation-reduction electrolyte 15, and are reduced again. The oxidized iodide ion receive the electrons from the reduction electrode, and is reduced again.

For the commercialization of such a dye-sensitized solar cell, it is still required to increase the efficiency of the energy conversion. The efficiency of the energy conversion of the dye-sensitized solar cell is influenced by the properties of the metal oxide semiconductor particle, the properties of the semiconductor electrode containing the particle, the properties of the electrolyte, and the properties of the reduction electrode, etc. Accordingly, improvements for these properties are required.

SUMMARY OF THE INVENTION

It is therefore an object of the present invention to provide an improved design for an photoelectrochemical cell.

It is further an object of the present invention to provide an improved reduction electrode for an photoelectrochemical cell.

It is also an object of the present invention to provide an improved semiconductor electrode for an photoelectrochemical cell.

It is still an object of the present invention to provide an improved particulate structure that can be used in an photoelectrochemical cell.

These and other objects can be achieved by a particulate structure exhibiting improved electron-transferring property, an electrode for a photoelectrochemical cell exhibiting improved electron-transferring property, an electrolyte composition for a photoelectrochemical cell exhibiting improved oxidation-reduction property, a reduction electrode for a photoelectrochemical cell exhibiting improved reduction property and a photoelectrochemical cell employing at least one aspect above.

A carbon nanotube lodged within a pore of a metal oxide semiconductor particle and attached to a metal oxide semiconductor layer provides an improved semiconductor electrode for a photoelectrochemical cell. The use of the carbon nanotube improves the electron transferring property of the cell. Alternatively, the photoelectrochemical cell can have a zinc oxide layer attached to a transparent substrate, the zinc oxide layer having prominences and depressions on the surface and having a metal oxide semiconductor particle attached to the prominence and depression surface.

Another aspect is an electrolytic solution for a photoelectrochemical cell containing a particle made up of a carbon nanotube with a magnesium oxide deposited on the carbon nanotube. Alternatively, the photoelectrochemical cell contains a particle made up of a carbon nanotube with cesium iodide and magnesium oxide deposited thereon.

A reduction electrode with a carbon nanotube attached to a conductive substrate. An electron donor material may be doped or coated on the carbon nanotube.

An photoelectrochemical cell using one or any combination of the reduction electrode with the nanotube, the semiconductor electrode containing the particle with the carbon nanotube, the electrolytic solution containing a particle containing a carbon nanotube and the zinc oxide layer formed on the conductive transparent substrate with a carbon nanotube attached to a depression or a prominence on the surface of the zinc oxide layer.

The particulate structure according to the present invention is made up of a porous metal oxide semiconductor particle and a carbon nanotube supported within a pore in the particle.

The photoelectrochemical cell according to an embodiment of the present invention is made up of a semiconductor electrode, a reduction electrode, and an oxidation-reduction electrolyte layer situated between the semiconductor electrode and the reduction electrode, the semiconductor electrode containing the particulate structure as described above.

A semiconductor electrode for a photoelectrochemical cell according to the present invention is made up of a transparent substrate, a zinc oxide layer attached to the substrate and having a prominence (or peak) and depression (or trough) surface formed a side facing away from the substrate and a metal oxide semiconductor particle attached to the peak and trough surface of the zinc oxide layer.

A photoelectrochemical cell according to another embodiment of the present invention includes a semiconductor electrode, a reduction electrode and an oxidation-reduction electrolyte layer situated between the semiconductor electrode and the reduction electrode, the semiconductor electrode being as described above.

The oxidation-reduction electrolyte for a photoelectrochemical cell according to the present invention includes a carbon nanotube on which magnesium oxide is deposited, or a carbon nanotube on which both magnesium oxide and cesium iodide are deposited, or mixtures thereof.

A photoelectrochemical cell according to still another embodiment of the present invention includes a semiconductor electrode, a reduction electrode, and an oxidation-reduction electrolyte layer situated between the semiconductor electrode and the reduction electrode, the oxidation-reduction electrolyte being as described above.

A reduction electrode for a photoelectrochemical cell according to an embodiment of the present invention includes a conductive substrate; and a carbon nanotube attached on one side of the substrate.

A photoelectrochemical cell according to still yet another embodiment of the present invention includes a semiconductor electrode, a reduction electrode, and an oxidation-reduction electrolyte layer situated between the semiconductor electrode and the reduction electrode, the reduction electrode being as described above.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
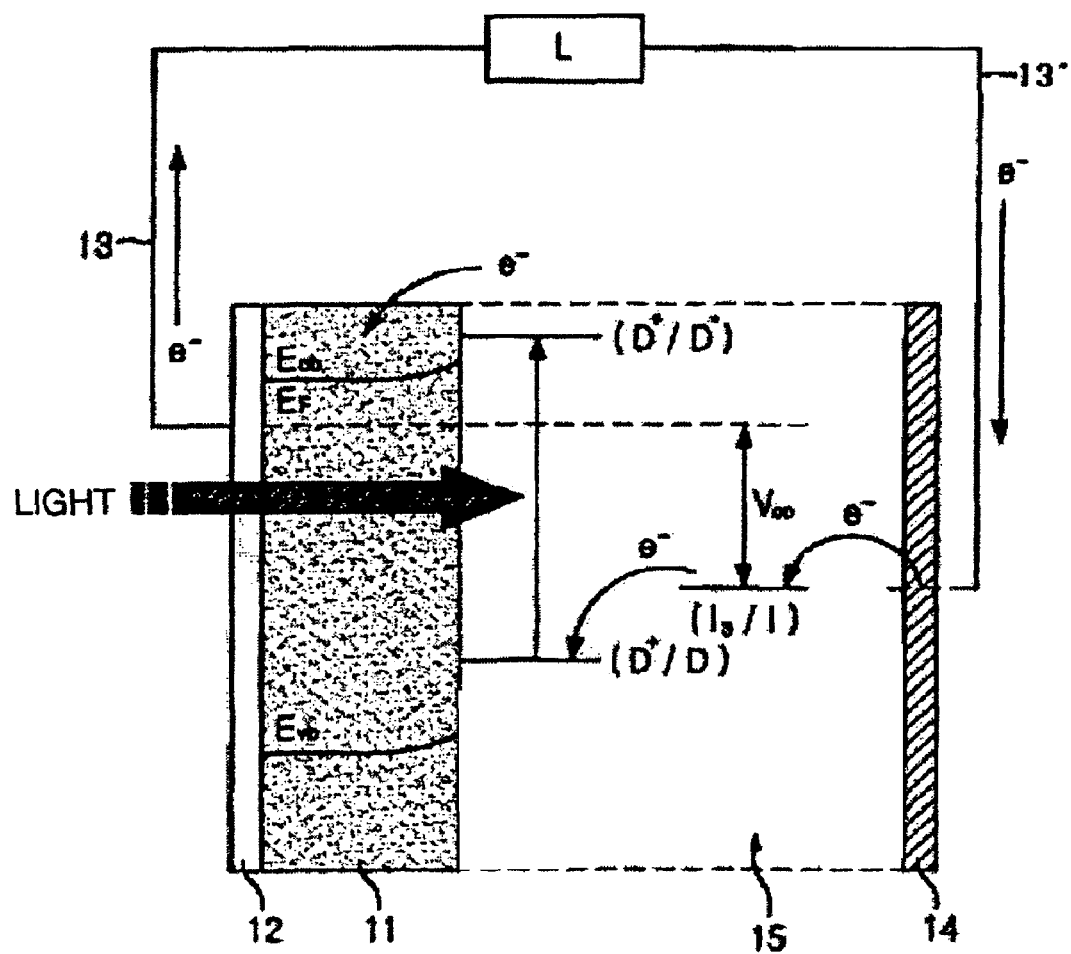
FIG. 1 is a schematic diagram showing the basic structure of the prior art photoelectrochemical cell.

Each aspect of the present invention will now be discussed.
Particulate Structure Hereinafter, the particulate structure according to the present invention will be described in more detail. A particulate structure according to the present invention is made up of a porous metal oxide semiconductor particle and a carbon nanotube supported in a pore of the particle.

The carbon nanotube promotes electron transfer. For example, when the particulate structure according to the present invention is used in a semiconductor electrode of a dye-sensitized solar cell, an electron generated from the photosensitive dye is much more easily transferred to the metal oxide semiconductor, and the electron is much more easily moved within the semiconductor electrode.

Such improvements in electron transfer property eventually lead to rise in an efficiency of the energy conversion for the dye-sensitized solar cell. The novel particulate structure according to the present invention allows for the electron transfer property of the metal oxide semiconductor particle is improved by the inclusion of the carbon nanotube supported in a pore of the porous metal oxide semiconductor particle.

The carbon nanotube of the particulate structure according to the present invention is the one grown based on a catalytic metal particle supported in a pore of the porous metal oxide semiconductor particle. The electron transfer property of such a particulate structure using the catalytic metal particle is more improved since the contact between the carbon nanotube and the porous metal oxide semiconductor particle becomes stronger and tighter.

The term "catalytic metal particle" means that the catalytic metal particle acts as a nucleus inducing and promoting the growth of the carbon nanotube. Accordingly, various metals capable of such functions can be used as the catalytic metal particles. Specific examples thereof include nickel, cobalt and iron, etc.

When the average size of the catalytic metal particle is too small, a non-metallic carbon nanotube may be produced. When the average size is too large, the density of the carbon nanotube may be decreased and accordingly the conductivity may be decreased. Considering this, the preferred size of the catalytic metal particle may be between 5 and 100 nm, and even more preferably about 10 to about 50 nm.

In the particulate structure according to the present invention, the carbon nanotube may be a single-wall carbon nanotube, a double-wall carbon nanotube, a multi-wall carbon nanotube, or mixtures thereof.

The upper limit and lower limit of the diameter of the carbon nanotube are not particularly limited, and the diameter of the carbon nanotube may be a diameter suitable for the carbon nanotube's being supported in a pore of a porous metal oxide semiconductor powder. Typically, the diameter of the carbon nanotube is about 10 to about 50 nm.

When the amount of the carbon nanotube in the particulate structure according to the present invention is too little, the effect of improving conductivity may be slight. When the amount is too much, the efficiency can be excessively decreased by light absorption. Considering this, the amount of carbon nanotube is preferably between 0.1 to about 5% by weight based on total weights of the particulate structure.

In the particulate structure according to the present invention, the porous metal oxide semiconductor particle acts as a carrier supporting the carbon nanotube.

When the average size of the porous metal oxide semiconductor particle is too small, the light transmission may be decreased. When the average size is too large, the amount of the pigment adsorption may be decreased. Considering this, the size of the porous metal oxide semiconductor particle is preferably between 10 and 100 nm.

When the average pore size of the porous metal oxide semiconductor particle is too small, the catalytic metal cannot be easily supported on the carbon nanotube. When the average pore size is too large, the amount of the supported catalytic metal may be decreased and accordingly the density of resulting carbon nanotube can be excessively decreased. Considering this, the pore size of the porous metal oxide semiconductor particle is preferably between 0.1 and 5 nm.

Specific examples of the porous metal oxide semiconductor particle include titanium dioxide, tin dioxide, niobium pentaoxide, and mixtures thereof. The specific examples of titanium dioxide particles include rutile, anatase, and mixtures thereof. These porous metal oxide semiconductor powders are available as commercial products, such as "nanoparticulate titanium dioxide" manufactured by Nano Corporation (Korea).

Method of Manufacturing the Particulate Structure

The method of manufacturing the particulate structure according to the present invention will now be described. The method of manufacturing the particulate structure according to the present invention generally includes supporting a catalytic metal particle on a porous metal oxide semiconductor particle and growing a carbon nanotube initiating from the catalytic metal particle.

The step of applying a catalytic metal particle on a porous metal oxide semiconductor particle can be performed by using the various ways of manufacturing methods of supported catalyst described in several literatures. For example, a solution (hereinafter, referred to impregnating solution) containing a precursor of a catalytic metal in state of metal salts can be impregnated into a porous metal oxide semiconductor particle, then the precursor of a catalytic metal can be subjected to oxidation-pyrolysis, and then the catalytic metal can be reduced by heat treatment at the reducing atmosphere, thus forming the catalytic metal particle in the pore of the porous metal oxide semiconductor particle. Examples of the precursor include nickel acetate, nickel chloride, cobalt acetate, cobalt chloride, iron oxalate, ferrocene, and mixtures thereof. The solvent that dissolves the precursor of the catalytic metal includes, for example, isopropyl alcohol, etc.

When the amount of precursor of the catalytic metal in the impregnating solution too little, the density of the resulting carbon nanotube can be decreased. When the amount is too much, the thickness of the carbon nanotube can be excessively increased by a phenomenon called "metal aggregation". Therefore, the amount of the precursor of the catalytic metal in the impregnating solution is preferably between 1 and 5% by weight.

By mixing together the porous metal oxide semiconductor powder and the impregnating solution, the impregnating solution can be impregnated into the pore of the porous metal oxide semiconductor particle. Typically, the mixing ratio of the porous metal oxide semiconductor powder to the impregnating solution is from 5:1 to 10:1.

The porous metal oxide semiconductor powder impregnated with the impregnating solution is subjected to drying. Herein "drying" means removing the solvent in the impregnating solution. The drying temperature can be properly selected depending on the properties of the used solvent and can be easily determined by those skilled in the art.

The dried porous metal oxide semiconductor is treated with heat, thus performing the oxidation-pyrolysis. When the temperature of heat treatment for the oxidation-pyrolysis is too low, the oxidation-pyrolysis cannot be performed. When the temperature is too high, the phenomenon metal aggregation and/or the saturation of the rate of the oxidation-pyrolysis can occur. Such a temperature for the oxidation-pyrolysis can be properly selected depending on the properties of the used precursor of the catalytic metal and can be easily determined by those skilled in the art. Typically, the temperature for the oxidation-pyrolysis is between 350 and 450° C.

The porous metal oxide semiconductor powder processed by the oxidation-pyrolysis process is subjected to heat treatment under a reducing atmosphere, thus reducing the precursor of the catalytic metal attached to the pore of the porous metal oxide semiconductor particle, to a metal particle. When the temperature of heat treatment for the reduction of the catalytic metal particle is too low, the reduction cannot be performed. When the temperature is too high, the phenomenon metal aggregation can occur. Such a reduction temperature can be properly selected depending on the properties of the used precursor of the catalytic metal and can be easily determined by those skilled in the art. Typically, the temperature for the oxidation-pyrolysis is between 350 and 450° C.

The carbon nanotube is grown in the porous metal oxide semiconductor particle that is obtained from such a procedure and supports the catalytic metal particles. The carbon nanotube is grown on the basis of the catalytic metal particle. To grow the carbon nanotube, for example, thermo-chemical vapor deposition, etc. can be used.

In the thermo-chemical vapor deposition, a gaseous carbon precursor, such as acetylene, methane, carbon monoxide/hydrogen gas mixture, etc., is fed, at high temperature and in non-oxidizing atmosphere, to the porous metal oxide semiconductor powder supported with a catalytic metal particle. Thus, the carbon precursor is adsorbed by the catalytic metal particle and then subjected to the pyrolysis, thus forming the carbon nanotube. The resulting carbon nanotube can be a single-wall, a double-wall and a multi-wall carbon nanotube.

When the temperature of the non-oxidizing atmosphere is too low in the thermo-chemical vapor deposition, the pyrolysis of the carbon precursor cannot be performed. When the temperature is too high, an excessive amount of metal aggregation can occur. An optimal temperature of the non-oxidizing atmosphere can be properly selected depending on the properties of the carbon precursor used and can be easily determined by those skilled in the art. Typically, the temperature of the high temperature at the non-oxidizing atmosphere is from 500 to about 600° C. The non-oxidizing atmosphere can be achieved by using, for example, carbon monoxide, hydrogen, etc.

When using the thermo-chemical vapor deposition in the synthesis of the carbon nanotube, the multi-wall carbon nanotubes are mainly formed. When the catalyst particle size is controlled below 10 nm or the synthesis temperature is maintained from 800 to about 1000° C. or more, the single-wall or multi-wall carbon nanotubes can be formed. The length of the carbon nanotubes varies depending on the synthesis time and the gas atmosphere, etc.

The particulate structure according to the present invention can be used as a semiconductor electrode material of a photoelectrochemical cell, such as a dye-sensitized solar cell, and a photocatalyst of various electrochemical apparatuses, such as an electrochemical cell, etc. Particularly, the particulate structure according to the present invention can be very suitably used as a semiconductor electrode material of a photoelectrochemical cell, such as a dye-sensitized solar cell, due to the improved electron conducting properties.

Semiconductor Electrode Containing the Particulate Structure

A semiconductor electrode for the photoelectrochemical cell according to the present invention will now be described in more detail. The semiconductor electrode according to the present invention includes a conductive transparent substrate and a metal oxide semiconductor layer attached on one side of the substrate, the semiconductor layer containing the particulate structure according to the present invention described above.

An example of a material for the conductive transparent substrate includes ITO (indium tin oxide), etc. The conductive transparent substrate further includes a light transmitting support. For example, the conductive transparent substrate includes light transmitting support and a conductive layer attached on one side of the support, the conductive layer may consist of the conductive material described above.

The conductive transparent substrate may take other various structures and forms. Accordingly, the conductive transparent substrate of the present invention includes any member having both light transmitting function and electron transferring function.

The semiconductor layer acts as an electron-transferring path. The conductive transparent substrate plays a roll of allowing light to transmit through while feeding the electron transferred through the semiconductor layer to an outer circuit.

When the thickness of the metal oxide semiconductor layer is too small, the light efficiency can be decreased since the amount of the adsorbed pigments is decreased. When the thickness is too large, the light efficiency can be decreased due to the decrease of the light transmittance. Considering this, the thickness of the semiconductor layer is preferably between 1 and 50 µm, and is typically 5 to 15 µm.

The semiconductor electrode can further include a photosensitive dye adsorbed to the particulate structure. The photosensitive dye is a compound that generates electrons and holes upon receiving light. An example of a photosensitive dye includes a ruthenium-based dye. The specific examples of the ruthenium-based photosensitive dyes include Ru(LL'(NCS)$_2$) (where L=2,2'-bipyridyl-4,4-dicarboxylic acid, L'=2,2'-bipyridyl-4,4-ditetrabutylammoniumcarboxylate), etc.

When the amount of the photosensitive dye adsorbed to the particulate structure is too little, the effect of the dye is too slight. When the amount is too much, the efficiency can be decreased due to the difficulty in dispersing, thus increasing the production cost. Considering this, the amount of adsorbed photosensitive dye can be between 0.1 and 5% by weight, and is typically between 0.5 and 1% by weight, based on 100 parts by weight of the particulate structure.

A method of manufacturing the semiconductor electrode according to the present invention will now be described in more detail. Firstly, a slurry for forming a semiconductor layer is prepared. The slurry for forming a semiconductor layer is prepared by mixing a metal oxide semiconductor powder and a dispersion medium. A representative example of the dispersion medium includes an ethyleneglycol, etc.

When the amount of the metal oxide semiconductor powder in the slurry for forming the semiconductor layer is too little, it can be difficult to fit the thickness of prints. When the amount is too much, it can be difficult to print. Considering this, the amount of the metal oxide semiconductor powder in the slurry for a semiconductor layer can be between 20 and 40% by weight.

If desired, the slurry for forming a semiconductor layer can further include an organic binder. A polyethylene oxide, etc can be mainly used as the organic binder. When the amount of the organic binder is too little, the adding effect can be slight. When the amount is too much, it can be difficult to remove it later or to print. Considering this, the amount of the organic binder in the slurry for a semiconductor layer is preferably between 5 and 10% by weight.

The slurry for forming a semiconductor layer is coated on the conducting layer of the conductive transparent substrate by a usual coating method, such as a spraying, a dipping, a printing and a doctor blading, and then dried and fired.

In the drying step, the dispersion medium in the coated slurry for forming a semiconductor layer is removed. The drying step can be performed at temperatures suitable to evaporate the dispersion medium, for example, from 50 to 100° C.

In the firing step, the organic binder, if used, in the dried slurry is oxidized and removed, and the metal oxide semiconductor powder is fixed on the conductive transparent substrate thus forming the semiconductor layer. The firing temperatures are typically about 400 to about 450° C.

If desired, the adsorption of the photosensitive dye can be performed by impregnating the fired semiconductor layer into a solution containing the photosensitive dye for 24 hours. Examples of the solvent used in the solution containing the photosensitive dye include a tertiarybutyl alcohol, an acetonitrile, and mixtures thereof.

Photoelectrochemical Cell Applying the Semiconductor Electrode Containing the Particulate Structure A photoelectrochemical cell employing the semiconductor electrode containing the particulate structure according to the present invention described above will be described in more detail as an embodiment of the photoelectrochemical cell of the present invention. The photoelectrochemical cell includes a semiconductor electrode, a reduction electrode, and an oxidation-reduction electrolyte layer positioned between the semiconductor electrode and the reduction electrode, the semiconductor electrode contains the particulate structure mentioned above. The semiconductor electrode containing the particulate structure is the same as described above.

The reduction electrode includes of an electron conductive material. The reduction electrode may also be a conductive transparent substrate. The reduction electrode may also be an electron conductive material coated on an electron insulating support. The specific examples of the electron conductive material include platinum, ITO and carbon, etc. The reduction electrode feeds the electrons recovered from an outer circuit on the electrolytic solution, thus reducing again the oxidized oxidation-reduction electrolytic components. The reduction electrode may also containing a carbon nanotube, according to the present invention.

The oxidation-reduction electrolytic layer may be the oxidation-reduction electrolytic solution itself, or a porous electron insulating matrix in which the oxidation-reduction electrolytic solution is impregnated.

An example of the oxidation-reduction electrolytic solution can include an electrolytic solution containing the redox system based on I—/I$_3$—. The electrolytic solution containing the redox system based on I—/I$_3$— contains I$_2$, an iodide and an organic solvent. Examples of the iodides include LiI, 1,2-dimethyl-3-octyl-imidazolium iodide, dimethylhexylimidazolium iodide, and mixtures thereof, etc. The organic solvent includes acetonitrile, 3-methoxy propionitrile, and mixtures thereof, etc.

Specific examples of the electrolytic solution containing the redox system based on I—/I$_3$— include [0.02M 1,2-dimethyl-3-octyl-imidazolium iodide+0.02M LiI+0.04M I$_2$+0.02M TBP (4-tert-butylpyridine)+acetonitrile] solution, [0.02M 1,2-dimethyl-3-octyl-imidazolium iodide+0.04M I$_2$+3-methoxypropionitrile] solution, [0.04M 1,2-dimethyl-3-hexyl- imidazolium iodide+acetonitrile] solution, etc.

The oxidation-reduction electrolytic solution can further include the photosensitive dye described above. The semiconductor layer of the semiconductor electrode used in an assembly of a photoelectrochemical cell does not need to adsorb the photosensitive dye necessarily in advance. When the amount of the photosensitive dye contained in the oxidation-reduction electrolytic solution is too little, the efficiency of light conversion can be excessively decreased. When the amount is too much, the dispersion cannot easily occur. Considering this, the amount of the photosensitive dye contained in the oxidation-reduction electrolytic solution can be from $10^{-4}$ to $10^{-3}$M.

The oxidation-reduction electrolytic solution can contain the carbon nanotube of the present invention described below. A polymer film, such as a foamed polyimide, can be used as the porous matrix. An assembly of the semiconductor electrode, the reduction electrode and the electrolytic layer in preparing the photoelectrochemical cell according to the present invention can be performed through a usual method of assembling easily recognized by those skilled in the art.

Semiconductor Electrode having an Improved Light Absorbency

A semiconductor electrode having an improved light absorbency, according to the present invention, will now be described in more detail. A semiconductor electrode having an improved light absorbency according to the present invention includes a transparent substrate, a zinc oxide layer attached on the substrate and having a prominence and a depression surface formed on a side opposite to that facing the substrate, and a metal oxide semiconductor layer attached on the prominence and depression surface of the zinc oxide layer.

In the semiconductor electrode having an improved light absorbency, the semiconductor layer attached on the prominence and depression surface has an increased area of the interface capable of absorbing light due to the presence of the zinc oxide layer whose one face is formed of a prominence and depression surface. Thus, the efficiency of the energy conversion is increased since the same amount of the incident light is treated by more semiconductor/dye components, compared to the zinc oxide layer without a prominence and depression surface. The zinc oxide layer acts as a conductor feeding the electron transferred from the semiconductor layer to an outer circuit, due to its electron conductivity.

The shape of a prominence and depression surface of the zinc oxide layer can include a wave shape in the form of stripes, an indentation shape in the form of stripes, a rectangular groove in the form of stripes, a convex shape in the form of islets, a concave shape in the form of crater, etc. Other various variations of such a shape, and the selection and control of the specific dimensions can be easily performed by those skilled in the art. Accordingly, there is no particular limitation herein.

When the thickness of the zinc oxide layer is too small, it can be difficult to form the proper prominence and depression surface. When the thickness is too large, the light transmittance can be excessively decreased. Considering this, the thickness of the zinc oxide layer is typically from 0.2 to 2 $\mu$m.

The transparent substrate can be electron conductive or electron insular. The examples of the transparent substrate include glass, ITO (indium tin oxide), and polyethyleneterephthalate, etc. Also, the conductive transparent substrate can further include a light transmitting support. For example, the conductive transparent substrate includes light transmitting support, and a conductive layer attached on one side of the support, the conductive layer may consist of the conductive material described above.

When the thickness of the metal oxide semiconductor layer is too small, the efficiency for generating electricity can be decreased since the amount of the pigment adsorption can be decreased. When the thickness is too large, the efficiency for generating electricity can be decreased due to the decrease of light transmittance. Considering this, the thickness of the semiconductor layer is preferably between 1 and 50 $\mu$m, and typically between 5 and 15 $\mu$m.

Examples of the metal oxide powder used in the metal oxide semiconductor layer include a titanium dioxide, a tin dioxide, a niobium pentaoxide, and mixtures thereof. The specific examples of the titanium dioxide particle include a rutile, an anatase, and mixtures thereof. These porous metal oxide semiconductor powders are available as commercial products, such as "nanoparticulate titanium dioxide" manufactured by Nano Corporation(Korea). Further, the particulate structure according to the present invention described above can also be used alone or in mixture with other metal oxides in the metal oxide semiconductor layer.

The semiconductor electrode having an improved light absorbency, according to the present invention, can further include a photosensitive dye adsorbed to the metal oxide semiconductor particle. The photosensitive dye is a compound that generates electrons and holes upon receiving light. An example of the photosensitive dyes includes a ruthenium-based dye. The specific examples of the ruthenium-based photosensitive dyes include $Ru(LL'(NCS)_2)$ (wherein L=2,2'-bipyridyl-4,4-dicarboxylic acid, L'=2,2'-bipyridyl-4,4-ditetrabutylammoniumcarboxylate), etc.

When the amount of the photosensitive dye adsorbed to the particulate structure is too little, its effect can be slight. When the amount is too much, the efficiency can be decreased due to the difficulty in dispersing, thus increasing the production cost of the cell. Considering this, the amount of the adsorbed photosensitive dye preferably is between 0.1 and 5% by weight, and typically from 0.5 to 1% by weight, based on 100 parts by weight of the particulate structure.

A method of manufacturing the semiconductor electrode having an improved light absorbency, according to the present invention, will now be described in more detail. First, a zinc oxide layer is coated on the transparent substrate. Various deposition methods, such as PVD and CVD, etc. can be used. Then a prominence and depression surface is formed by etching a free face of the zinc oxide layer coated on the transparent substrate with the photolithography.

A semiconductor layer is formed on the prominence and depression surface of the resulting zinc oxide layer. The slurry for forming a semiconductor layer is prepared by mixing a metal oxide semiconductor powder and a dispersion medium. A representative example of the dispersion medium includes ethyleneglycol, etc.

When the amount of the metal oxide semiconductor powder is too little in the slurry for forming the semiconductor layer, the efficiency for generating electricity can be decreased due to the decrease of the amount of the adsorbed pigment. When the amount is too much, the efficiency for generating electricity can be decreased due to the increase of light absorption. Considering this, the amount of the metal oxide semiconductor powder in the slurry for a semiconductor layer may be from 20 to 40% by weight.

If desired, the slurry for forming a semiconductor layer may further include an organic binder. A polyethylene oxide, etc can be mainly used as the organic binder. When the amount of the organic binder is too little, it can be difficult to print and the adding effect may be slight. When the amount is too much, it can be difficult to remove it on firing. Considering this, the amount of the organic binder in the slurry for a semiconductor layer can be from 5 to 10% by weight. The slurry for forming a semiconductor layer is coated on the rough face by a usual coating method, such as a spraying, a dipping, a printing and a doctor blading, and then dried and fired.

In the drying step, the dispersion medium in the coated slurry for forming a semiconductor layer is removed. The drying step can be performed at temperatures suitable to evaporate the dispersion medium, for example, between 50 and 100° C.

In the firing step, the organic binder, if used, in the dried slurry is oxidized and removed, and the metal oxide semiconductor powder is fixed on the conductive transparent substrate thus forming the semiconductor layer. The firing temperatures may be typically about 400 to about 450° C.

If desired, the adsorption of the photosensitive dye may be performed by impregnating the fired semiconductor layer into the solution containing the photosensitive dye for more than 24 hours. Examples of the solvent used in the solution containing the photosensitive dye include tertiarybutyl alcohol, acetonitrile, and mixtures thereof.

Photoelectrochemical Cell Employing the Semiconductor Electrode having Improved Light Conversion A photoelectrochemical cell employing the semiconductor electrode having an improved light absorbency will now be described in more detail as another embodiment of the photoelectrochemical cell of the present invention. The photoelectrochemical cell includes a semiconductor electrode, a reduction electrode and an oxidation-reduction electrolyte layer located between the semiconductor electrode and the reduction electrode, the semiconductor electrode is the one having an improved absorbency, according to the present invention, as mentioned above. That is, the semiconductor electrode includes a transparent substrate, a zinc oxide layer attached on the substrate and having a prominence and depression surface formed on opposite side of the face contacting with the substrate, and a metal oxide semiconductor layer attached on the prominence and depression surface of the zinc oxide layer. The details of the semiconductor electrode are the same as described above.

The reduction electrode includes an electron conductive material. The reduction electrode may also be a conductive transparent substrate. The reduction electrode may also be an electron conductive material coated on an electron insulating support. The specific examples of the electron conductive material include platinum, ITO and carbon, etc. The reduction electrode feeds the electrons recovered from an outer circuit to the electrolytic solution, thus reducing again the oxidized oxidation-reduction electrolytic components. The reduction electrode may also be the one containing a carbon nanotube, according to the present invention.

The oxidation-reduction electrolytic layer may be the oxidation-reduction electrolytic solution itself, or a porous electron insulating matrix in which the oxidation-reduction electrolytic solution is impregnated. An example of the oxidation-reduction electrolytic solution can include an electrolytic solution containing the redox system based on I—/I$_3$—. The electrolytic solution containing the redox system based on I—/I$_3$— contains I$_2$, an iodide and an organic solvent. The examples of the iodides include LiI, 1,2-dimethyl-3-octyl-imidazolium iodide, dimethylhexylimidazolium iodide, and mixtures thereof, etc. The organic solvent includes acetonitrile, 3-methoxy propionitrile, and mixtures thereof, etc.

The specific examples of the electrolytic solution containing the redox system based on I—/I$_3$— include [0.02M 1,2-dimethyl-3-octyl-imidazolium iodide+0.02M LiI+0.04M I$_2$+0.02M TBP (4-tert-butylpyridine)+acetonitrile] solution, [0.02M 1,2-dimethyl-3-octyl-imidazolium iodide+0.04M I$_2$+3-methoxypropionitrile] solution, [0.04M 1,2-dimethyl-3-hexyl-imidazolium iodide+acetonitrile] solution, etc.

The oxidation-reduction electrolytic solution can further include the photosensitive dye described above. The semiconductor layer of the semiconductor electrode used in an assembly of a photoelectrochemical cell does not need to adsorb the photosensitive dye necessarily in advance.

When the amount of the photosensitive dye contained in the oxidation-reduction electrolytic solution is too little, the efficiency of light conversion can be excessively decreased. When the amount is too much, the dispersion cannot easily occur and the production cost can be high. Considering this, the amount of the photosensitive dye contained in the oxidation-reduction electrolytic solution can be from $10^{-4}$ to $10^{-3}$M.

The oxidation-reduction electrolytic solution may be the one containing the carbon nanotube of the present invention described below. A polymer film, such as a foamed polyimide, may be used as the porous matrix. The assembly of the semiconductor electrode, the reduction electrode and the electrolytic layer in preparing the photoelectrochemical cell according to the present invention can be performed through a usual method of assembling easily recognized to those skilled in the art.

Oxidation-reduction Electrolytic Solution for a Photoelectrochemical Cell Containing a Carbon Nanotube An oxidation-reduction electrolytic solution for a photoelectrochemical cell according to the present invention will now be described in more detail. The oxidation-reduction electrolytic solution for a photoelectrochemical cell according to the present invention contains a carbon nanotube on which magnesium oxide is deposited, or a carbon nanotube on which magnesium oxide and cesium iodide are deposited, or mixtures thereof.

5% of sunlight is made up of ultraviolet light in the range of 200 to 400 nm. The carbon nanotube on which magnesium oxide is deposited, or the carbon nanotube on which magnesium oxide and cesium iodide are deposited can emit electrons when illuminated by such ultraviolet light. Thus, the photoelectrochemical cell employing the electrolytic solution according to the present invention has improved efficiency in the energy conversion.

The carbon nanotube that can be used in the oxidation-reduction electrolytic solution according to the present invention can be a single-wall carbon nanotube, a double-wall carbon nanotube, a multi-wall carbon nanotube, or mixtures thereof.

When the diameter of the carbon nanotube is too small, the conductivity can be decreased. When the diameter is too large, the conductivity can be decreased due to the decrease of the density of the carbon nanotube. Considering this, the diameter of the carbon nanotube can be from 10 to 100 nm, and typically from 30 to 50 nm.

The carbon nanotube plays a role in supporting a magnesium oxide and/or a cesium iodide and acts as an electron conductor. The magnesium oxide and/or the cesium iodide can be deposited on the circumference of the carbon nanotube, for example, by the electron beam deposition.

When the thickness of the magnesium oxide and/or the cesium iodide deposited on the carbon nanotube is too small, the amount of the light current can be little. When the thickness is too large, the amount of the light current can also be little. Considering this, the thickness of the magnesium oxide and/or the cesium iodide deposited on the carbon nanotube is preferably from 300 to 1000 nm.

When the amount of the carbon nanotube on which a magnesium oxide is deposited, or the carbon nanotube on which a magnesium oxide and a cesium iodide are deposited is too little in the oxidation-reduction electrolytic solution for a photoelectrochemical cell according to the present invention, the conductivity can be decreased. When the amount is too much, the efficiency can be decreased due to the increase of light absorption. Considering this, the amount is preferably between 0.1 to about 1% by weight, based on the total weights of the electrolytic solution.

An embodiment of the oxidation-reduction electrolytic solution according to the present invention is an electrolytic solution containing the redox system based on I—/I$_3$—. The electrolytic solution containing the redox system based on I—/$I_3$—, according to the present invention, contains a carbon nanotube on which a magnesium oxide is deposited, or a carbon nanotube on which a magnesium oxide and a cesium iodide are deposited, $I_2$, an iodide, and an organic solvent. The examples of iodides include LiI, 1,2-dimethyl-3-octyl-imidazolium iodide, dimethylhexylimidazolium iodide, and mixtures thereof, etc. The organic solvent includes acetonitrile, 3-methoxy propionitrile, and mixtures thereof, etc.

Specific examples of the electrolytic solution containing the redox system based on I—/$I_3$— include [0.02M 1,2-dimethyl-3-octyl-imidazolium iodide+0.02M LiI+0.04$M_2$+0.02M TBP (4-tert-butylpyridine)+acetonitrile] solution, [0.02M 1,2-dimethyl-3-octyl-imidazolium iodide+0.04M $I_2$+3-methoxypropionitrile] solution, [0.04M 1,2-dimethyl-3-hexyl-imidazolium iodide+acetonitrile] solution, etc.

The oxidation-reduction electrolytic solution can further include the photosensitive dye described above. The semiconductor layer of the semiconductor electrode used in an assembly of a photoelectrochemical cell does not need to adsorb the photosensitive dye necessarily in advance.

When the amount of the photosensitive dye contained in the oxidation-reduction electrolytic solution is too little, the efficiency of light conversion can be excessively decreased. When the amount is too much, the dispersion cannot easily occur and the production cost of the cell can be high. Considering this, the amount of the photosensitive dye contained in the oxidation-reduction electrolytic solution can be from $10^{-4}$ to $10^{-3}$ M.

Photoelectrochemical Cell Employing the Oxidation-reduction Electrolytic Solution Containing a Carbon Nanotube A photoelectrochemical cell employing the oxidation-reduction electrolytic solution according to the present invention described above will now be described in more detail. The photoelectrochemical cell includes a semiconductor electrode, a reduction electrode, and an oxidation-reduction electrolyte layer positioned between the semiconductor electrode and the reduction electrode, the oxidation-reduction electrolyte layer contains the electrolytic solution according to the present invention mentioned above.

The oxidation-reduction electrolytic layer may be the oxidation-reduction electrolytic solution itself according to the present invention mentioned above, or a porous electron insulating matrix in which the oxidation-reduction electrolytic solution according to the present invention mentioned above is impregnated. The semiconductor electrode includes a conductive transparent substrate and a metal oxide semiconductor layer attached on one side of the substrate.

An example of a material for the conductive transparent substrate includes ITO (indium tin oxide), etc. The conductive transparent substrate can further include a light transmitting support. For example, the conductive transparent substrate includes light transmitting support, and a conductive layer attached on one side of the support, the conductive layer may consist of the conductive material described above.

The conductive transparent substrate may take other various structures and forms. Accordingly, the conductive transparent substrate of the present invention includes any member having both light transmitting function and electron transferring function.

The semiconductor layer acts as an electron-transferring path. The conductive transparent substrate plays a roll in transmitting light into the cell and feeding the electron transferred through the semiconductor layer to an outer circuit.

When the thickness of the metal oxide semiconductor layer is too small, the light efficiency can be decreased since the amount of the adsorbed pigment is decreased. When the thickness is too large, the price of the cell can be expensive due to the increase of the amount of the consumed pigments. Considering this, the thickness of the semiconductor layer is preferably from 1 to 50 μm, and typically from 5 to 15 μgm.

The semiconductor electrode according to the present invention can further include a photosensitive dye adsorbed to the particulate structure. The photosensitive dye is a compound that generates electrons and holes upon receiving light. An example of the photosensitive dyes includes a ruthenium-based dye. The specific examples of the ruthenium-based photosensitive dyes include Ru(LL'(NCS)$_2$) (wherein L=2,2'-bipyridyl-4,4-dicarboxylic acid, L'=2,2'-bipyridyl-4,4-ditetrabutylammoniuncarboxylate), etc.

When the amount of the photosensitive dye adsorbed to the particulate structure is too little, the efficiency of light conversion can be decreased. When the amount is too much, it can be difficult to disperse it and the high production cost can occur. Considering this, the amount of the adsorbed photosensitive dye is preferably between 0.1 and 5% by weight, and preferably 0.5 to 1% by weight, based on 100 parts by weight of the particulate structure.

Further, the semiconductor electrode can also be a semiconductor electrode containing the particulate structure according to the present invention mentioned above, or a semiconductor electrode having an improved light absorbency according to the present invention mentioned above.

The reduction electrode includes an electron conductive material. The reduction electrode may also be a conductive transparent substrate. The reduction electrode may also be an electron conductive material coated on an electron insulating support. The specific examples of the electron conductive material include platinum, ITO and carbon, etc. The reduction electrode feeds the electrons recovered from an outer circuit to the electrolytic solution, thus reducing again the oxidized oxidation-reduction electrolytic components. The reduction electrode may also be the one containing a carbon nanotube according to the present invention described below.

Reduction Electrode for a Photoelectrochemical Cell Containing a Carbon Nanotube A reduction electrode for a photoelectrochemical cell according to the present invention will now be described in more detail. A reduction electrode for a photoelectrochemical cell according to an embodiment of the present invention includes a conductive substrate, and a carbon nanotube attached on one side of the substrate.

In the photoelectrochemical cell, the reduction electrode feeds the electrons recovered from an outer circuit to the oxidation-reduction electrolyte, thus reducing again the oxidized components in the oxidation-reduction electrolyte. The reduction electrode according to the present invention has much improved performance of feeding electrons to the oxidation-reduction electrolyte due to the powerful electron transferring property of the carbon nanotube attached on its surface. Further, the reduction electrode according to the present invention has highly increased area at the electron transferring interface, i.e., the area that the reduction electrode and the electrolyte contact each other, due to the surface area of the carbon nanotube particles attached on its surface. Thus, the reduction electrode according to the present invention has excellent performance in reducing the oxidized components in the oxidation-reduction electrolyte.

The examples of the material for the conductive substrate in the reduction electrode according to the present invention include metals such as platinum, conductive oxides such as ITO (indium tin oxide) or zinc oxide, etc. The conductive substrate can also be a conductive transparent substrate capable of transmitting light. The conductive substrate can also be an electron conductive layer coated on an electron insulating support that transmits or doesn't transmit light. The electron conductive layer may consist of the conductive material as described above. The support includes glass and plastic, etc.

The carbon nanotube that can be used in the reduction electrode according to the present invention can be a single-wall carbon nanotube, a double-wall carbon nanotube, a multi-wall carbon nanotube, or mixtures thereof.

When the diameter of the carbon nanotube is too small, the conductivity can be decreased. When the diameter is too large, the reducing property can be decreased due to the decrease of the density of the carbon nanotube. Considering this, the diameter of the carbon nanotube is preferably 1 to 100 nm, and typically about 30 to about 50 nm.

When the amount of the carbon nanotube in the reduction electrode according to the present invention is too little, the adding effect can be slight. When the amount is too much, the electrode membrane can be delaminated. Considering this, the amount of the carbon nanotube can be from 10 to 50 mg per apparent area in $cm^2$.

The reduction electrode can further include an electron donor material doped or coated on the carbon nanotube. Alkali metal, such as potassium, rubidium, etc. and tin oxide, etc. can be used alone or in combination as the electron donor materials.

When the amount of the electron donor material doped or coated on the carbon nanotube is too little, the adding effect can be slight. When the amount is too much, the carbon nanotube can be disrupted. Considering this, the amount of the electron donor material doped or coated on the carbon nanotube is between 1 and 20 parts by weight, and more preferably from 3 to 5 parts by weight, based on 100 parts by weight of the carbon nanotube. The electron donor materials play a role in further enhancing the electron transferring property of the carbon nanotube.

Photoelectrochemical Cell Employing the Reduction Electrode Containing a Carbon Nanotube A photoelectrochemical cell employing the reduction electrode according to the present invention described above will now be described in more detail as still another embodiment of the photoelectrochemical cell according to the present invention. The photoelectrochemical cell includes a semiconductor electrode, a reduction electrode, and an oxidation-reduction electrolyte layer located between the semiconductor electrode and the reduction electrode, the reduction electrode being one according to the present invention as described above.

The semiconductor electrode includes a conductive transparent substrate and a metal oxide semiconductor layer attached on one side of the substrate.

An example of material for the conductive transparent substrate includes ITO (indium tin oxide), etc. The conductive transparent substrate can further include a light transmitting support. For example, the conductive transparent substrate includes light transmitting support, and a conductive layer attached on one side of the support, the conductive layer may consist of the conductive material as described above.

The conductive transparent substrate may take other various structures and forms. Accordingly, the conductive transparent substrate of the present invention includes any member having both light transmitting function and electron transferring function.

The semiconductor layer acts as an electron-transferring path. The conductive transparent substrate plays a roll in transmitting light into the cell and feeding the electron transferred through the semiconductor layer to an outer circuit.

When the thickness of the metal oxide semiconductor layer is too small, the light efficiency can be decreased since the amount of the adsorbed pigment is decreased. When the thickness is too large, the price of the cell can be expensive due to the increase of the amount of the consumed pigments. Considering this, the thickness of the semiconductor layer is preferably between 1 and 50 µm, and is typically between 5 and 15 µm.

The semiconductor electrode according to the present invention can further include a photosensitive dye adsorbed to the particulate structure. The photosensitive dye is a compound that generates electrons and holes upon receiving light. An example of the photosensitive dyes includes a ruthenium-based dye. The specific examples of the ruthenium-based photosensitive dyes include $Ru(LL'(NCS)_2)$ (wherein L=2,2'-bipyridyl-4,4-dicarboxylic acid, L'=2,2'-bipyridyl-4,4-ditetrabutylammoniumcarboxylate), etc.

When the amount of the photosensitive dye adsorbed to the particulate structure is too little, its effect can be slight. When the amount is too much, the light efficiency can be decreased since it can be difficult to disperse it. Considering this, the amount of the adsorbed photosensitive dye is preferably 0.1 to 5% by weight, and is typically from 0.5 to 1% by weight, based on 100 parts by weight of the particulate structure.

Further, the semiconductor electrode can also be a semiconductor electrode containing the particulate structure according to the present invention as mentioned above, or a semiconductor electrode having an improved light absorbency according to the present invention mentioned above.

The oxidation-reduction electrolytic layer may be the oxidation-reduction electrolytic solution itself, or a porous electron insulating matrix in which the oxidation-reduction electrolytic solution is impregnated.

An example of the oxidation-reduction electrolytic solution can include an electrolytic solution containing the redox system based on I—/$I_3$—. The electrolytic solution containing the redox system based on I—/$I_3$— contains $I_2$, an iodide and an organic solvent. The examples of the iodides include LiI, 1,2-dimethyl-3-octyl-imidazolium iodide, dimethylhexylimidazolium iodide, and mixtures thereof, etc. The organic solvent includes acetonitrile, 3-methoxy propionitrile, and mixtures thereof, etc.

The specific examples of the electrolytic solution containing the redox system based on I—/$I_3$— include [0.02M 1,2-dimethyl-3-octyl-imidazolium iodide+0.02M LiI+0.04M $I_2$+0.02M TBP (4-tert-butylpyridine)+acetonitrile] solution, [0.02M 1,2-dimethyl-3-octyl-imidazolium iodide+0.04$M_2$+3-methoxypropionitrile] solution, [0.04M 1,2-dimethyl-3-hexyl-imidazolium iodide+acetonitrile] solution, etc.

The oxidation-reduction electrolytic solution can further include the photosensitive dye described above. The semiconductor layer of the semiconductor electrode used in an assembly of a photoelectrochemical cell does not need to adsorb the photosensitive dye necessarily in advance.

When the amount of the photosensitive dye contained in the oxidation-reduction electrolytic solution is too little, the light efficiency can be decreased. When the amount is too much, the light efficiency can be decreased and it can cause the high production cost since the dispersion cannot easily occur. Considering this, the amount of the photosensitive dye contained in the oxidation-reduction electrolytic solution can be from $10^{-4}$ to $10^{-3}$M.

The oxidation-reduction electrolytic solution can also be the one according to the present invention described above. A polymer film, such as a foamed polyimide, can be used as the porous matrix. The assembly of the semiconductor electrode, the reduction electrode and the electrolytic layer in preparing the photoelectrochemical cell according to the present invention can be performed through a usual method of assembling easily recognized to those skilled in the art.

Photoelectrochemical Cell in which the Semiconductor Electrode, the Reduction Electrode and the Oxidation-reduction Electrolytic Layer Contain a Carbon Nanotube, Respectively Further, the present invention provides a photoelectrochemical cell in which the semiconductor electrode, the reduction electrode and the oxidation-reduction electrolytic layer contain a carbon nanotube, respectively.

The photoelectrochemical cell includes a semiconductor electrode having a conductive transparent substrate and a metal oxide semiconductor layer attached on one side of the substrate, the semiconductor layer contains the particulate structure described above, a reduction electrode having a conductive substrate and a carbon nanotube attached on one side of the substrate, and an oxidation-reduction electrolyte layer positioned between the semiconductor electrode and the reduction electrode, and including an oxidation-reduction electrolytic solution containing a carbon nanotube on which magnesium oxide is deposited, or a carbon nanotube on which magnesium oxide and cesium iodide are deposited, or mixtures thereof. The details of the semiconductor electrode, the reduction electrode and the oxidation-reduction electrolytic layer are the same as described above.

The present invention will be described in greater detail with reference to the following examples. The following examples are for illustrative purposes and are not intended to limit the scope of the invention.

EXAMPLES

Example 1

Preparation of the Modified Metal Oxide Semiconductor Powder

In the example, the titanium dioxide powder ("nanoparticulate titanium dioxide" of Nano Corporation(Korea)) was used as the porous metal oxide semiconductor powder. The properties of the titanium dioxide powder are summarized in table 1.

TABLE 1

| Average particle size | Average pore size | Surface area | Porosity |
|---|---|---|---|
| 20 nm | 100 Å | 50 m$^2$/g | 0.2 cm$^3$/g |

The titanium dioxide powder in which the nickel metal particles are supported as the catalytic metal particles was prepared by mixing 0.97 g of titanium dioxide powder and 0.03 g of 3% by weight of nickel nitrate solution in isopropyl alcohol, drying the mixture at 50° C. in the air for 30 minutes, performing oxidation-pyrolysis of the mixture at 450° C. in air for 1 hour, and then reducing the catalytic metal at 350° C. in the 5% hydrogen atmosphere for 1 hour.

The titanium dioxide powder in which the nickel metal particles are supported was placed into a reactor at 550° C., and acetylene and hydrogen were fed thereto for 30 minutes, thus growing a carbon nanotube on the base of the nickel metal particles.

The properties of the resulting particulate structure are summarized in table 2.

TABLE 2

| Type of the carbon nanotube | Diameter of the carbon nanotube | Length of the carbon nanotube | Amount of the carbon nanotube |
|---|---|---|---|
| Multi-wall | 30 nm | 1.5 μm | 1% by weight |

Example 2

Preparation of the Semiconductor Electrode having an Improved Light Conversion

The conductive ITO glass was used as the conductive transparent substrate.

A zinc oxide layer having a thickness of 0.5 μm was deposited on the conductive transparent substrate by electron beam deposition. Then, a pattern of a rectangular groove in the form of stripes, having a groove width of 100 μm, a groove spacing of 100 μm and a groove depth of 0.5 μm, was formed on the free face of the zinc oxide layer by photolithography.

A slurry for forming a semiconductor layer was prepared by mixing 20 g of the modified metal oxide semiconductor powder obtained from example 1 and 80 g of ethyleneglycol.

The slurry for forming a semiconductor layer was coated on the rough face of the zinc oxide layer by a printing method, then dried and fired. At this time, drying was performed at 100° C. in the air atmosphere for 30 minutes, and firing was performed at 450° C. in the air atmosphere for 30 minutes. The thickness of the resulting semiconductor layer was 8 to 10 μm.

Thus, the semiconductor electrode containing the modified metal oxide powder, having an improved light conversion was obtained according to the present invention.

Example 3

Preparation of the Oxidation-reduction Electrolytic Solution Containing a Carbon Nanotube After a multi-wall carbon nanotube having a diameter of 50 nm and a length of 1.5 μm was grown at 550° C. with the thermal deposition method using carbon monoxide and hydrogen, a magnesium oxide layer having a thickness of 50 nm was formed on the carbon nanotube employing the electron beam deposition.

The oxidation-reduction electrolytic solution containing the carbon nanotube was prepared by mixing 7 g of thus obtained carbon nanotube containing the magnesium oxide, 5.6 g of $I_2$, 13.2 g of dimethylhexylimidazolium iodide, 0.05 g of ruthenium pigment (manufactured by STI company) and 730 g of acetonitrile.

Example 4

Preparation of the Reduction Electrode Containing a Carbon Nanotube

The carbon nanotube used in this example was a carbon nanotube having a diameter of 30 nm and a length of 1.5 μm, synthesized at 550° C. by mixing carbon monoxide and hydrogen employing the thermal deposition method.

1 g of a carbon nanotube, 0.05 g of tin oxide and 100 g of 1% by weight of HCl aqueous solution were mixed, and stirred at ambient temperature for 1 hour. The mixed solution was dried at 50° C. for 1 hour to prepare the carbon nanotube coated with tin oxide.

1 g of the carbon nanotube coated with tin oxide and 50 g of isopropyl alcohol were mixed to prepare a carbon nanotube coating solution. The coating solution was coated on the conductive substrate employing the spin coating method. The conductive substrate used at this time was ITO glass conductive substrate.

Thus coated coating solution was dried at 50° C. for 30 minutes to prepare the reduction electrode on which the carbon nanotube coated with tin oxide is attached. The amount of the carbon nanotube coated with tin oxide was 0.01 g/cm$^2$.

Example 5

Preparation of the Photoelectrochemical Cell

The photoelectrochemical cell was prepared by using the semiconductor electrode, the oxidation-reduction electrolytic solution and the reduction electrode obtained from examples 2~4.

Both electrodes maintain the spacing of 20 μm by a spacer. After introducing the oxidation-reduction electrolytic solution, the photoelectrochemical cell was sealed.

When measuring the prepared solar cell by the voltage (V)–current (I) curve chaser (available at Techno Inc.) at 1 kW/m$^2$ and 50 degrees Celsius, the efficiency of the fibrous solar cell according to the present invention was 7%, which is higher than 5% of the efficiency of Gratzel cell (manufactured by Sustainable Technologies International)

When the particulate structure is used in the semiconductor electrode of the dye-sensitized solar cell, the electrons generated from the photosensitive dye can be more easily transferred to the metal oxide semiconductor. The migration of electrons within the semiconductor electrode is also more easily achieved.

The semiconductor electrode having an improved light conversion has an increased interface area in which the semiconductor layer can absorb light, due to the zinc oxide layer having a rough face. Thus, the efficiency of the energy conversion is increased since the same amount of incident light is treated by more semiconductor/dye components compared to the case without a rough face.

The carbon nanotube on which magnesium oxide is deposited or a carbon nanotube on which magnesium oxide and cesium iodide are deposited, contained in the oxidation-reduction electrolytic solution according to the present invention, can emit electrons by the ultraviolet light at 200~400 nm. Thus, the photoelectrochemical cell applying the electrolytic solution according to the present invention has improved efficiency of the energy conversion.

The reduction electrode according to the present invention has much improved performance of feeding electrons to the oxidation-reduction electrolyte due to the powerful electron transferring property of the carbon nanotube attached on its surface. The reduction electrode according to the present invention has highly increased area at the electron transferring interface, i.e., the area that the reduction electrode and the electrolyte contact each other, due to the surface area of the carbon nanotube particles attached on its surface. Thus, the reduction electrode according to the present invention has very excellent performance of reducing the oxidized components in the oxidation-reduction electrolyte.

Consequently, the photoelectrochemical cell applying at least one of the semiconductor electrode, the oxidation-reduction electrolytic solution and the reduction electrode has much improved efficiency of the energy conversion.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A structure, comprising:
a metal oxide semiconductor particle comprising a pore;
a catalytic metal particle arranged within the pore of the porous metal oxide semiconductor particle, a size of the catalytic metal particle being 5 nm to 100 nm; and
a carbon nanotube arranged within the pore of the metal oxide semiconductor particle, wherein the carbon nanotube being grown based on the catalytic metal particle arranged within the pore of the porous metal oxide semiconductor particle.

2. The structure of claim 1, the carbon nanotube being selected from the group consisting of a conductive single-wall carbon nanotube, a conductive double-wall carbon nanotube, a conductive multi-wall carbon nanotube and mixtures thereof.

3. The structure of claim 1, a diameter of the carbon nanotube being between 10 and 50 nm.

4. The structure of claim 1, an amount of the carbon nanotube being 0.1 to 1% by weight based on the total weights of the structure.

5. The structure of claim 1, an average particle size of the porous metal oxide semiconductor particle being 10 to 100 nm.

6. The structure of claim 1, the porous metal oxide semiconductor particle comprising a material selected from the group consisting of a titanium dioxide, a tin dioxide, a niobium pentaoxide and mixtures thereof.

7. A semiconductor electrode, comprising:
a transparent substrate; and
a metal oxide semiconductor layer attached on one side of the substrate, the semiconductor layer comprising a structure comprising:
a metal oxide semiconductor particle comprising a pore;
a catalytic metal particle arranged within the pore of the porous metal oxide semiconductor particle; and
a carbon nanotube arranged within the pore of the metal oxide semiconductor particle, wherein the carbon nanotube being grown based on the catalytic metal particle arranged within the pore of the porous metal oxide semiconductor particle.

8. The semiconductor electrode of claim 7, further comprising a photosensitive dye adsorbed to the structure.

9. A photoelectrochemical cell, comprising:
a semiconductor electrode;
a reduction electrode; and
an oxidation-reduction electrolyte layer arranged between the semiconductor electrode and the reduction electrode, the semiconductor electrode comprises a structure comprising:
a metal oxide semiconductor particle comprising a pore;
a catalytic metal particle arranged within the pore of the porous metal oxide semiconductor particle; and
a carbon nanotube arranged within the pore of the metal oxide semiconductor particle, wherein the carbon nanotube being grown based on the catalytic metal particle arranged within the pore of the porous metal oxide semiconductor particle.

10. The photoelectrochemical cell of claim 9, the photoelectrochemical cell having an efficiency of 7%.

11. The structure of claim 1, a size of the catalytic metal particle being 10 nm to 50 nm.

12. The semiconductor electrode of claim 7, a size of the catalytic metal particle being 5 nm to 100 nm.

13. The semiconductor electrode of claim 7, a size of the catalytic metal particle being 10 nm to 50 nm.

14. The photoelectrochemical cell of claim 9, a size of the catalytic metal particle being 5 nm to 100 nm.

15. The photoelectrochemical cell of claim 10, a size of the catalytic metal particle being 10 nm to 50 nm.

* * * * *